United States Patent
Okandan et al.

(10) Patent No.: US 9,595,628 B1
(45) Date of Patent: Mar. 14, 2017

(54) MICROSTRUCTURED SILICON RADIATION DETECTOR

(71) Applicant: Sandia Corporation, Albuquerque, NM (US)

(72) Inventors: Murat Okandan, Edgewood, NM (US); Mark S. Derzon, Albuquerque, NM (US); Bruce L. Draper, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/456,934

(22) Filed: Aug. 11, 2014

(51) Int. Cl.
*H01L 31/115* (2006.01)
*H01L 31/028* (2006.01)

(52) U.S. Cl.
CPC ........ *H01L 31/115* (2013.01); *H01L 31/0284* (2013.01)

(58) Field of Classification Search
USPC ............... 257/291, 429, 431, 443, 446, 458, 257/E31.061; 438/80, 81, 429, 433, 434
See application file for complete search history.

(56) References Cited

U.S. PATENT DOCUMENTS

| | | |
|---|---|---|
| 6,479,826 B1 | 11/2002 | Klann et al. |
| 6,528,797 B1 | 3/2003 | Benke et al. |
| 6,545,281 B1 | 4/2003 | McGregor et al. |
| 6,727,505 B2 | 4/2004 | Benke et al. |
| 6,781,132 B2 | 8/2004 | McGregor |
| 6,806,474 B2 | 10/2004 | McGregor et al. |
| 6,921,903 B2 | 7/2005 | McGregor et al. |
| 7,164,138 B2 | 1/2007 | McGregor et al. |
| 7,855,372 B2 | 12/2010 | McGregor et al. |

OTHER PUBLICATIONS

Bellinger, S.L. et al., "Advanced Microstructured Semiconductor Neutron Detectors: Design, Fabrication and Performance", Dissertation KSU (2011) pp. 1-42.
Bellinger, S.L. et al., "Characteristics of 3D Micro-Structured Semiconductor High Efficiency Neutron Detectors", IEEE Transactions on Nuclear Science, (2009), pp. 742-746, vol. 56.
Bellinger, S.L. et al., "Characteristics of the Stacked Microstructured Solid-State Neutron Detector", Proc. of SPIE, (2010), vol. 7805.
Bellinger, S.L. et al. "Enhanced variant designs and characteristics of the microstructured solid-state neutron detector", Nuclear Instruments and Methods in Physics Research A, (2011), pp. 387-391, vol. 652.
Bellinger, S.L. et al., "High Efficiency Dual-Integrated Stacked Microstructured Solid-State Neutron Detectors", IEEE Nuclear Science Symposium, Knoxville, TN, (2010).

(Continued)

*Primary Examiner* — Ori Nadav
*Assistant Examiner* — Vernon P Webb
(74) *Attorney, Agent, or Firm* — Martin I. Finston

(57) ABSTRACT

A radiation detector comprises a silicon body in which are defined vertical pores filled with a converter material and situated within silicon depletion regions. One or more charge-collection electrodes are arranged to collect current generated when secondary particles enter the silicon body through walls of the pores. The pores are disposed in low-density clusters, have a majority pore thickness of 5 μm or less, and have a majority aspect ratio, defined as the ratio of pore depth to pore thickness, of at least 10.

17 Claims, 8 Drawing Sheets

(56) References Cited

OTHER PUBLICATIONS

Bellinger, S.L. et al., "Improved Fabrication Technique for Microstructured Solid-State Neutron Detectors", Mater. Res. Soc. Symposium Proceedings, (2009), pp. L06-L01, vol. 1164.

Bellinger, S.L. et al., "Improved High Efficiency Stacked Microstructured Neutron Detector Backfilled With Nanoparticle LiF", IEEE Transactions on Nuclear Science, (2012), pp. 167-173, vol. 59.

Bellinger, S.L. et al., "Variant Designs and Characteristics of Improved Microstructured Solid-State Neutron Detectors", IEEE Nuclear Science Symposium, Olrando, FL, (2009), pp. 986-989.

Danon, Y. et al., "Towards high efficiency solid-state thermal and fast neutron detectors", 2nd International Workshop on Fast Neutron Detectors and Applications, Israel (2011).

Henderson, C.M. et al., "Characterization of prototype perforated semiconductor neutron detectors", Radiation Physics and Chemistry, (2010) pp. 144-150, vol. 79.

Jahan, Q. et al., "Neutron dosimeters employing high-efficiency perforated semiconductor detectors", Nuclear Instruments and Methods in Physics and Research B, (2007), pp. 183-185, vol. 263.

Lehmann, V. et al., "Formation Mechanism and Properties of Electrochemically Etched Trenches in n-Type Silicon", J. Electrochem Soc. (1990), pp. 653-659, vol. 137.

Lehmann, V. "The Physics of Macropore Formation in Low Doped n-Type Silicon", J. Electrochem. Soc. (1993) pp. 2836-2843, vol. 140.

McGregor, D.S. et al., "Design considerations for thin film coated semiconductor thermal neutron detectors, Part I: Basics Regarding Alpha Particle Emitting Neutron Reactive Films", Nuclear Instruments and Methods in Physics Research A, (2003), pp. 272-308, vol. 500.

McGregor, D.S. et al., "Designs for Thin-Filmed-Coated Semiconductor Neutron Detectors", Conference Record of the IEEE Nuclear Science Symposium, San Diego, California, Nov. 4-9, 2001.

McGregor, D.S. et al., "Micro-Structured High-Efficiency Semiconductor Neutron Detectors", IEEE Nuclear Science Symposium, Dresden, Germany, (2008), pp. 446-448.

McGregor, D.S. et al., "Microstructured Semiconductor Neutron Detectors", Nuclear Instruments and Methods in Physics Research A, (2009), pp. 125-131, vol. 608.

McGregor, D.S. et al., "Perforated diode neutron detector modules fabricated from high-purity silicon", Radiation Physics and Chemistry, (2009), pp. 874-881, vol. 78.

McGregor, D.S. et al., "Perforated Semiconductor Diodes for High Efficiency Solid State Neutron Detectors", Workshop of Use of Monte Carlo Techniques for Design and Analysis of Radiation Detectors, Portugal, 2006.

McGregor, D.S. et al., "Perforated Semiconductor Neutron Detector Modules", Proc. of 32nd Annual GOMACTech Cofn., Lake Buena Vista, FL, (2007).

McGregor, D.S., et al., "New Surface Morphology for Low Stress Thin-Film-Coated Thermal Neutron Detectors", IEEE Transactions on Nuclear Science, pp. 1999-2004, vol. 49.

McGregor, D.S. et al., "Present status of microstructured semiconductor neutron detectors", Journal of Crystal Growth, (2013), pp. 99-110, vol. 379.

McGregor, D.S. et al., "Recent Results From Thin-Film-Coated Semiconductor Neutron Detectors", Proc of SPIE, (2002), pp. 164-182, vol. 4784.

McGregor, D.S. et al., "Reporting detection efficiency for semiconductor neutron detectors: A need for a standard", Nuclear Instruments and Methods in Physics Research A, (2011), pp. 167-174, vol. 632.

McGregor, D.S. et al., "Thin-Film-Coated Detectors for Neutron Detection", Journal of the Korean Association for Radiation Protection, (2001), pp. 167-175, vol. 26.

McGregor, D.S. et al., "Thin-Film-Coated Detectors for Neutron Detection", Conference Record of the First iTRS International Symposium on Radiation Safety and Detection Technology, Seoul, Korea, (2001).

McNeil, W.J. et al., "1-D array of perforated diode neutron detectors", Nuclear Instruments and Methods in Physics Research A, (2009), pp. 127-129, vol. 604.

McNeil, W.J. et al., Development of Perforated Si Diodes for Neutron Detection:, IEEE Nuclear Science Symposium, San Diego, CA Oct. 29-Nov. 3, 2006.

McNeil, W.J. et al., "Perforated Diode Fabrication for Neutron Detection", IEEE Nuclear Science Symposium, San Diego, CA, (2006), pp. 3732-3735.

Muller, F. et al., "Structuring of Macroporous Silicon for Applications as Photonic Crystals", Journal of Porous Materials, (2000), pp. 201-204, vol. 7.

Nikolic, R.J. et al., "Pillar Structured Thermal Nuclear Detector", International Conference on Solid-State and Integrated-Circuit Technology, Beiging, China, (2008) LLNL-PROC-404677.

Shao, Q. et al. "Gamma discrimination in pillar structured thermal neutron detectors", LLNL Proc 543492, (2012).

Shultis, J.K. et al., "Design and performance considerations for perforated semiconductor thermal-neutron detectors", Nuclear Instruments and Methods in Physics Research A, (2009), pp. 60-636, vol. 606.

Shultis, J.K. et al., "Designs for Micro-Structured Semiconductor Neutron Detetors", Proc. of SPIE, pp. 06:01-06:15, vol. 7079.

Solomon, C.J. et al., "Reduced efficiency variation in perforated neutron detectors with sinusoidal trench design", Nuclear Instruments and Methods in Physics Research A, (2010) pp. 260-265, vol. 618.

Unruh, Troy C. et al. "Design and operation of a 2-D thin-film semiconductor neutron detector array for use as a beamport monitor", Nuclear Instruments and Methods in Physics Research, (2009), pp. 150-153, vol. 604.

MICROSTRUCTURED SILICON RADIATION DETECTOR

STATEMENT OF GOVERNMENT INTEREST

This invention was developed under Contract DE-AC04-94AL85000 between Sandia Corporation and the U.S. Department of Energy. The U.S. Government has certain rights in this invention.

FIELD OF THE INVENTION

This invention relates to semiconductor diode radiation detectors.

ART BACKGROUND

It has long been known that a neutron detector can be made by placing a semiconductor diode adjacent to a thin film of a sensor material that reacts with neutrons. Typically, an (n,γ) or (n,α) reaction takes place in the sensor film. The interaction of the released photon or alpha particle with the semiconductor leads to the generation of electron-hole pairs that can be detected in a suitable electronic circuit.

More recently, it has been recognized that greater detector efficiency can be achieved in so-called "microstructured semiconductor neutron detectors" (MSNDs) in which the semiconductor is patterned with an array of holes or trenches filled with sensor material, or in which the semiconductor is patterned as an array of columns surrounded by a fill of sensor material.

A review and modeling study of diode detectors based on hole arrays, trench arrays, and columnar arrays is provided, for example, in D. S. McGregor et al., "Present status of microstructured semiconductor neutron detectors," *J. Crystal Growth* 379 (2013) 99-110.

A recent report on columnar arrays is provided, for example, in Q. Shao, et al., "Gamma discrimination in pillar structured thermal neutron detectors," SPIE defense security and sensing 2012" (Baltimore, Md., Apr. 23-27, 2012), published as LLNL-PROC-543492 (Lawrence Livermore National Laboratory, Mar. 30, 2012).

A patent disclosing perforated semiconductor neutron detectors diode detectors based on hole or trench arrays is U.S. Pat. No. 7,164,138, which issued on Jan. 16, 2007 to D. S. McGregor and Raymond Klann under the title, "High-efficiency neutron detectors and methods of making same." An embodiment described in U.S. Pat. No. 7,164,138 patent utilizes a semiconductor wafer with a matrix of spaced cavities filled with one or more types of neutron reactive material such as $^{10}$B or $^6$LiF. The cavities may be etched via holes or etched slots or trenches.

A trench-based detector is disclosed in U.S. Pat. No. 7,855,372, issued on Dec. 21, 2010 to D. S. McGregor et al. under the title, "Non-streaming high-efficiency perforated semiconductor neutron detectors, methods of making same and measuring wand and detector modules utilizing same." In that detector, the semiconductor is patterned as an array of sinuous fins spaced apart by a corresponding array of sinuous channels containing neutron-sensing material.

Devices such as those described in the publications and patents cited above have shown significant promise, not least because they offer advantages of ruggedness, compactness, and reliability. However, there remains a need for devices that have still greater sensitivity, as well as for devices that offer similar advantages for the detection of other forms of radiation such as gamma radiation.

SUMMARY OF THE INVENTION

We have developed a semiconductor diode radiation detector, adaptable for, among other things, gamma-ray or neutron detection, that offers the potential for high sensitivity in a rugged and compact package.

In an embodiment, the detector includes a silicon body having a horizontal lateral extent and containing a plurality of vertical pores. Although the pores in exemplary embodiments described below are holes with cylindrical with circular cross sections, the term "pore" is meant here to encompass cavities having a broad range of shapes, including holes with square, rectangular, triangular, hexagonal, or other cross sections, and also trenches in which one lateral dimension is substantially greater than the other.

In the said embodiment, at least one n-type region and at least one p-type region are formed within the silicon body and arranged to define one or more depletion regions. A depletion region is a portion of the silicon body that exhibits carrier depletion when a reverse bias of sufficient magnitude is applied between the n-type and p-type regions.

The pores are situated within depletion regions. The pores are at least partially filled with a converter material selected to produce secondary particles when impinged by radiation of at least one type. By way of example, but without limitation, an incident neutron may generate a recoil proton when the neutron interacts with a converter material within the pores. The recoil proton is, in that instance, an example of a secondary particle.

Each of one or more charge-collection electrodes is arranged to collect current generated when secondary particles enter the silicon body through walls of the pores. Each pore is a void that is vertically extensive to a pore depth and enclosed within silicon walls. Each pore has a thickness defined as the pore diameter or, if the pore is not round, the smallest lateral dimension of the pore.

The pores are disposed in one or more clusters. For specificity, the boundary of a cluster is defined by drawing a minimum-length boundary around the pores where they intersect a face of the silicon body, and by projecting the resulting closed curve perpendicularly through the silicon body so as to define a volume in three dimensions that contains the pores corresponding to a given cluster.

In a cluster, the total silicon density is less than the solid density of the silicon body because the pores (when unfilled) are void. More specifically, the total silicon density in the clusters is reduced by the pores to 20%-50% of the solid density of the silicon body, and is preferably about 25% of the solid density.

Most (ideally all) of the pores have a pore thickness less than or equal to 5 μm and an aspect ratio (defined as the ratio of pore depth to pore thickness) of at least 10.

To continue the example of a (p, n) reaction referred to above, the recoil proton may generate electron-hole pairs within the silicon body, including the silicon walls that separate one pore from another. The migration of the electron-hole pairs to the charge-collection electrodes provides the detector current. The detector current is thus cumulative over a volume that in typical instances will contain many pores filled with converter material.

In embodiments, most (ideally all) of the pores have a depth of at least 20 μm.

In embodiments, the pore thickness is small enough to permit a substantial fraction of the secondary particles to escape from the converter material into the silicon body. In at least some such embodiments, therefore, the pore thickness is no more than the range of the secondary particles in the converter material. The converter material filling a particular pore may be one of several different converter materials used in the detector. The range referred to here is the range of the secondary particles at the mean energy generated by incident (i.e., primary) particles of at least one energy within the primary energy range that is to be detected.

In embodiments, the p-type and n-type regions are disposed in vertically oriented layers such that under negative bias, each pore is traversed by a substantially horizontal electric field.

In embodiments, the p-type and n-type regions are disposed such that a region of one predominant carrier type is disposed in vertically oriented layers, and the region of the other predominant carrier type is disposed at or near a bottom face of the silicon body.

In embodiments, at least one gate electrode is included to promote carrier depletion within the semiconductor body under appropriate biasing conditions.

DETAILED DESCRIPTION

Figure 1:
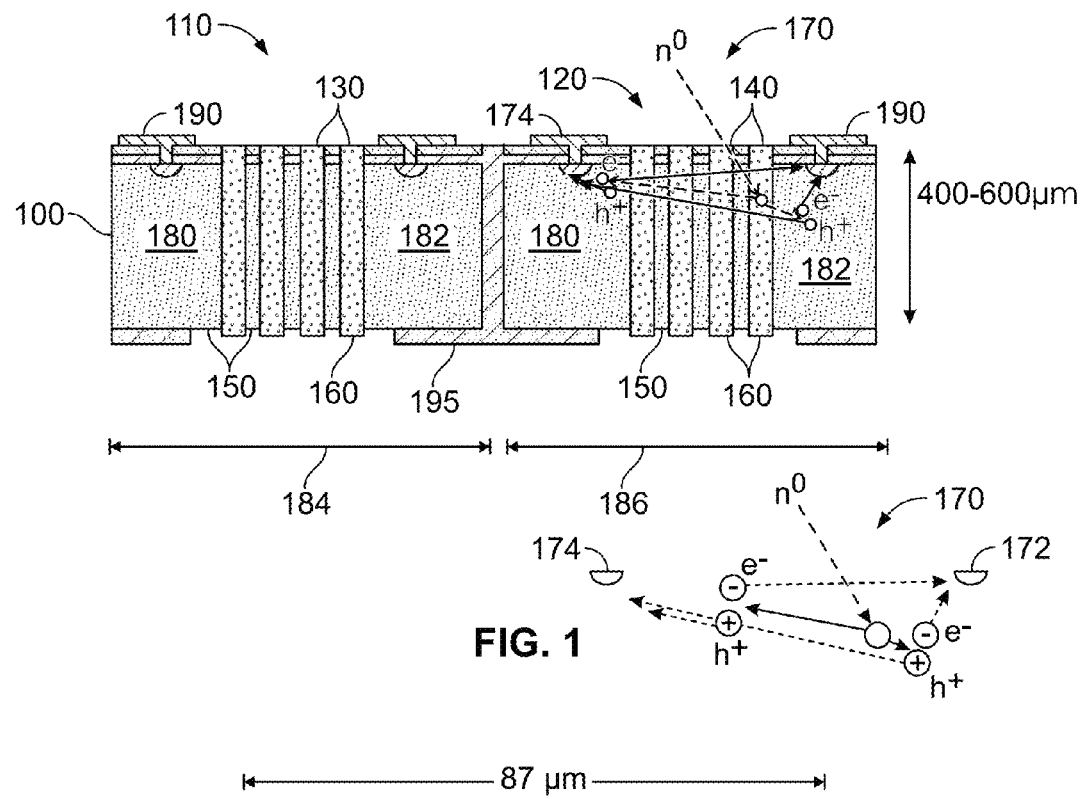
FIG. 1 is a schematic cross-sectional diagram of a radiation sensor according to an embodiment of the invention.

Processes for making porous silicon are known. For example, an electrochemical etching process for forming macropores, i.e. pores having a diameter greater than 50 nm, is described in F. Mueller et al., "Structuring of Macroporous Silicon for Applications as Photonic Crystals," *J. Porous Materials* 7 (2000) 201-204. As reported in Mueller et al., an n-type (100) silicon wafer is photolithographically patterned to define the sites where etch pits are to be formed. The etch pits are essential for initiating the subsequent electrochemical etching of the pores. Alkaline etching of the patterned wafer produces the etch pits, which are conformed as inverted pyramids, at the desired sites. The wafer is then etched in hydrofluoric acid under anodic bias. Backside illumination for the photogeneration of holes is maintained during the etch. Hole generation is necessary to promote the dissolution of silicon at the pore tips. Mueller et al. reported the production of hexagonally arranged pores with a diameter of 0.9 µm, a center-to-center spacing of 1.5 µm, and a depth of 100 µm.

A similar process is described in somewhat more detail by V. Lehmann and H. Foell, "Formation Mechanism and Properties of Electrochemically Etched Trenches in n-type Silicon," *J. Electrochem. Soc.* 137 (February 1990) 653-659, cited in Mueller et al., supra. Among other things, Lehmann and Foell reported pore diameters in the range 1-10 µm obtained by etching n-type silicon wafers of resistivities in the range 10-300 Ω-cm. Lehmann and Foell also reported pore depths up to 300 µm, although widened cavities were observed at the bottoms of the pores that had the greatest depths. The authors commented that for hydrofluoric acid concentrations greater than those used in their experiments, pore growth through the entire wafer thickness should be possible.

Further discussion of macropore formation in silicon may be found in V. Lehmann, "The Physics of Macropore Formation in Low Doped n-Type Silicon," *J. Electrochem. Soc.* 140 (October 1993) 2836-2843, cited in Mueller et al., supra. The entirety of each of the three works cited above is hereby incorporated herein by reference.

In view of the literature discussed above, we believe that without undue experimentation, processes similar to those that were reported can be used to create porous regions in lithographically defined areas of a silicon wafers that reach to a depth of several hundred micrometers, or even penetrate all the way through the wafer. We believe that through control of parameters such as the n-type doping concentration of the wafer, substantially uniform pore diameters in the range 1-10 µm, or even smaller, can be produced.

By way of illustration, we believe that a region can be permeated by a hexagonal array of pores with a pore diameter of 10 µm and a center-to-center separation of 10.88 µm, which would yield a minimum wall thickness between pores of 0.88 µm. If the pores were perfectly cylindrical, 80% of such a region would be void, and 20% would be silicon. Likewise, a similar pattern of pores of diameter 5 µm and center-to-center separation 5.44 µm would have a minimum wall thickness of 0.44 µm and a silicon density that is 20% of the solid density. A porous-to-solid density ratio of 25% is currently preferred for at least some applications in radiation detection. Porous-to-solid density ratios in the range 20%-50% are believed to be especially useful. Similarly, a pore thickness of 5 µm is believed adequate for some applications in radiation detection. A pore thickness of 2 µm or less is believed preferable, not least because it permits the detection of radiation over a greater range of primary particle types and energies.

In an alternative procedure for pore creation, Bosch etch or other deep reactive ion etch (DRIE) techniques may be used to penetrate silicon layers 40 µm thick, or even more, with pores that are as little as 2-5 µm in diameter, or even less.

Turning now to FIG. 1, there will be seen a silicon substrate 100 including two porous silicon regions 110 and 120, each penetrated by a group of four pores, designated in one group by the reference numeral 130 and in the other group by the reference numeral 140. The figure is purely illustrative and is not meant to limit the arrangement or quantity of any features that are represented therein. As seen in the figure, the walls of each pore are passivated with a dielectric liner 150, exemplarily of silicon dioxide or silicon nitride. The purpose of the passivation liner is to suppress leakage current, which could otherwise contribute an excessively high background signal.

For use in a neutron detector, by way of example, the pores are filled with a neutron-sensitive converter material 160 such as lithium-6 or boron-10 in elemental or compound form. The lithium and boron isotopes react to neutron capture by emitting an alpha particle according to the respective reactions $^6$Li(n,α)$^3$H and $^{10}$B(n,α)$^7$Li. The alpha particle, in turn, can interact with the surrounding silicon substrate material to generate electron-hole pairs which are collected, as will be further explained below, to produce a detector output signal.

A representative reaction 170 is illustrated in the figure, where a neutron is shown entering the converter material, and a pair of secondary particles, typically alpha particles (represented only by arrows) is shown leaving the converter material and entering the silicon substrate material. Each of the secondary particles is shown as stopping within the silicon substrate and generating an electron-hole pair that is collected by respective electrodes. That is, an electric field is created by applying a reverse bias to a diode structure that contains the porous silicon region within which the converter material is situated. Under the influence of the electric field, the electron migrates to the n-type electrode 172 and the hole migrates to the p-type electrode 174.

For efficient detection of neutrons or other radiative particles, it is desirable to assure that a substantial fraction of the secondary particles (e.g., alpha particles) will be able to escape from the pores in which they are generated, so that they can be stopped within the silicon substrate material where they will generate electron-hole pairs. To facilitate the escape of the secondary particles, it is desirable to limit the pore thickness to no more than the range of the secondary particles within the converter material. For that reason, it will generally be advantageous for the pore thickness to be at most 5 μm.

By way of illustration, 1.47-MeV alpha particles have a range of about 5 μm in silicon and about 3.5 μm in boron. Further, 0.84-MeV lithium-7 nuclei have a range of about 5 μm in silicon and about 1.8 μm in boron.

With further reference to FIG. 1, it will be seen that semiconductor junctions are formed between p-type regions 180 and n-type regions 182, so as to create respective diode structures 184 and 186. More specifically, porous silicon region 110 is contained within diode structure 184 and porous silicon region 120 is likewise contained within diode structure 186. As seen in the figure, regions 180 and 182 are formed on the front side of the wafer by lithographic patterning, followed by deposition and diffusion of appropriate dopants. Such an arrangement is merely exemplary and not meant to be limiting. For example, junctions may be formed on the back side of the wafer, or even through the thickness of the silicon layer. Some possible alternative arrangements will be described below.

In operation, the junctions are reverse biased through metal contacts 190 so as to achieve substantial carrier depletion in the vicinity of the porous silicon regions. Nearly complete depletion is desirable to minimize the background signal from the detector while efficiently collecting the radiation-generated carriers from throughout the sensing volumes.

We believe that the geometry of porous silicon is very favorable for efficient charge generation and collection because we expect to achieve substantially complete depletion of the network of silicon forming the pore walls as well as the surrounding silicon, while also maintaining an electric field in the vicinity of the converter material within the pores. Moreover, the small pore diameters make it possible for a substantial fraction of short-range particles such as alpha or beta particles generated by the primary radiation interactions to escape from the converter material and stop within the silicon depletion region with enough remaining energy to be detected via electron-hole generation.

Because the electron-hole pairs are generated in depleted silicon, few of the generated carriers will be lost to recombination, hence they will be collected with high efficiency. Stated differently, if the mass-weighted fill ratio is, e.g., 80%, then very roughly 80% of the secondary particle energy will be deposited in the converter material that fills the pores. However, if the pores are thin enough, there will be relatively little stopping of secondary particles within the converter material, and a substantial fraction of the secondary particles will instead escape the fill into the surrounding silicon. Hence the deposition of secondary particle energy in the fill will be attributable more to the slowing of particles that ultimately escape than to the stopping of secondary particles within the fill. Significantly, a substantial fraction of the escaping particles will interact with the silicon energetically enough to generate detectable carrier pairs. We expect that the carriers generated in that fashion can be collected and detected with about twenty percent efficiency or even more.

In some known microstructured semiconductor neutron detectors, by contrast, the silicon substrate contains cavities filled with converter material at a thickness that is several times the secondary particle range. In such arrangements, it is possible for the detected particles to have greater average energy than in the scheme described here, but we believe that on average, fewer secondary particles will escape from the fill with enough energy to be detected. We therefore believe that the scheme described here offers the possibility of more efficient detection of secondary particles.

We expect that the advantages of our design will become more pronounced as the pore thickness decreases and the ratio of surface area to volume correspondingly increases.

Thus, the various factors discussed above will cooperate to facilitate very efficient charge collection from the entire sensor volume. As noted above, we estimate that an 80% fill ratio, by volume, of converter material will enable a detector to be made that has useful sensitivity, while enjoying various other advantages such as ruggedness and compactness, as well as the possibility of pixelation, which is discussed below.

Furthermore, our detector can be optimized for the efficient detection of specified forms of primary radiation. That is, the kind of secondary radiation that is generated, its energy, and its range depend on the primary radiation and on the converter material. The pore dimensions can be specified with reference to a specific choice of converter material so as to optimize energy deposition in the silicon by the secondary particles for a specified type of primary radiation and even for specified energy ranges of the primary radiation. By optimizing in that way, the detector can be designed for at least partial spectroscopic discrimination.

With further reference to FIG. 1, it will be seen that the device as illustrated includes a silicon dioxide partition 195 that separates diode structure 184 from diode structure 186. By lithographic patterning that includes a system of partitions such as partition 195, a linear or two-dimensional array of pixels can be defined, in which each pixel corresponds to a diode structure such as structures 184 and 186. More generally, each pixel will include at least one pn junction. Thus, some implementations are envisaged in which each diode structure corresponds to a respective pixel, whereas other implementations are envisaged in which each pixel encompasses a plurality of diode structures or pn junctions. In either case, however, it should be understood that each pixel will encompass a multiplicity of pores.

Figure 2:
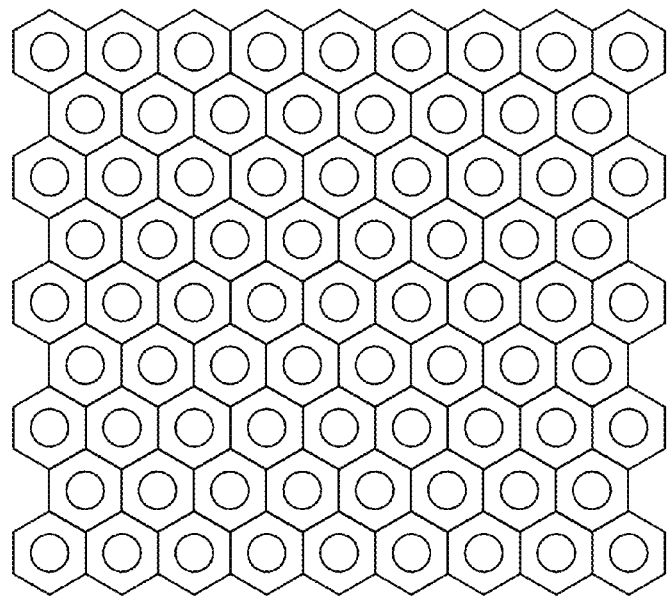
FIG. 2 is a geometrical diagram illustrating a hexagonal arrangement of pores useful in the practice of embodiments of the invention.

A typical pixel for a two-dimensional (2D) array would be a square of side length 100 μm. A 100-μm square pixel containing a hexagonal array of 10-μm-diameter pores with a center-to-center separation of 10.88 μm could contain, for example, a total of 77 pores or even somewhat more, as shown in FIG. 2.

Further, two or more 2D arrays such as we have described could be stacked to form a three-dimensional (3D) array for full volume detection and tracking of fragments. Such a detector array would allow higher resolution than a single monolithic detector of similar volume, and it could permit new types of measurements to be carried out. In particular, high-speed tracking of events in two or three dimensions could be facilitated by co-integrating SOI-based components for on-board charge storage, data storage, and data processing with the pixel arrays.

As noted above, pixel arrays can be integrated on a single wafer. Alternatively, individual pixels and other detector components can be processed on a wafer and subsequently separated for later reassembly on a detector substrate by any of various known techniques.

Figure 3:
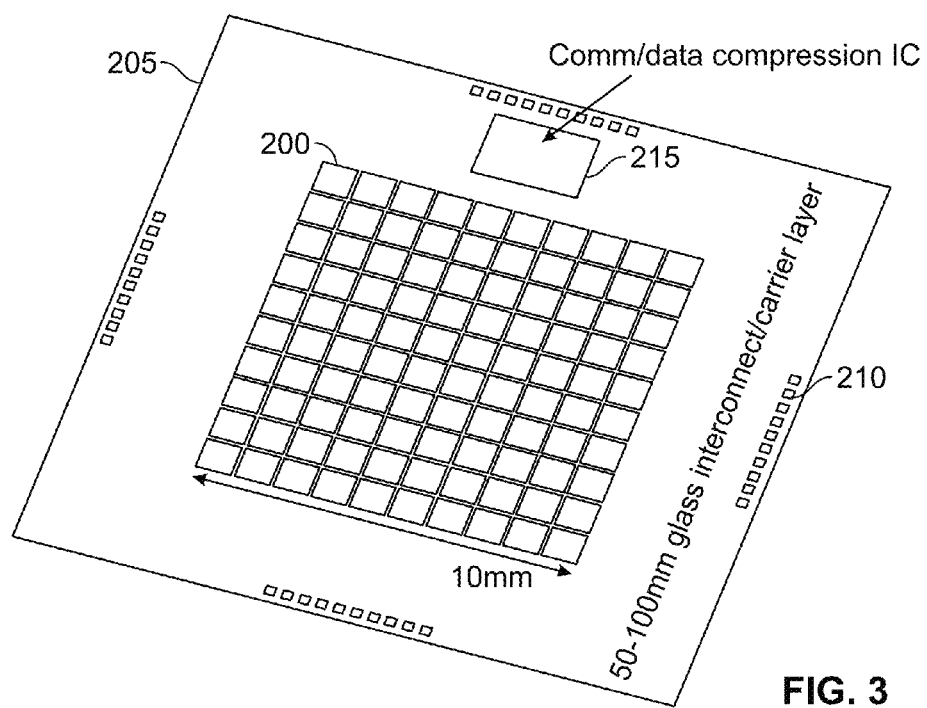
FIGS. 3-6 are views of two-dimensional and three-dimensional pixelated arrays of radiation sensors, and assemblies thereof, according to embodiments of the invention.

FIG. 3 provides an example of a 10×10 array of detectors 200, each of which is a 1 mm square subarray of individual pixels. Such an array can be mounted, e.g., on a glass carrier 205 of thickness 50-100 μm. As seen in the figure, the carrier also has metal traces 210 to carry signals to a separate processor IC 215 that might be used, for example, for data compression and communication.

Figure 4:
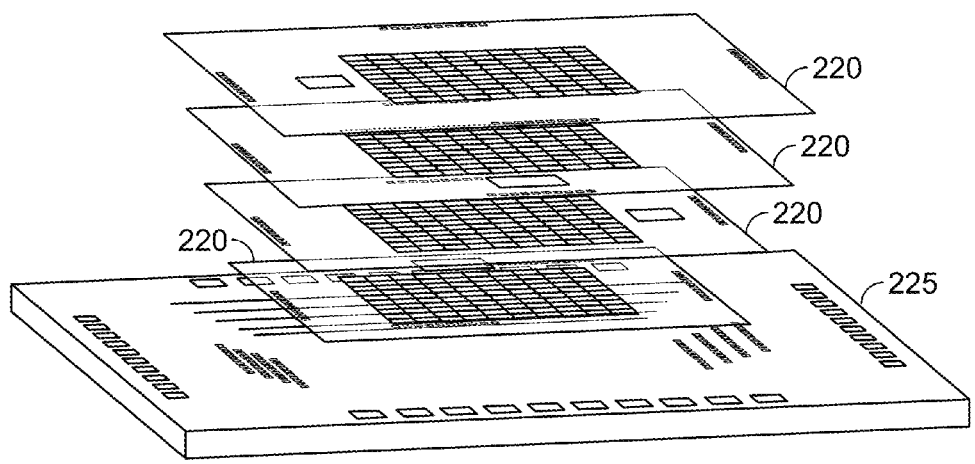
Figure 5:
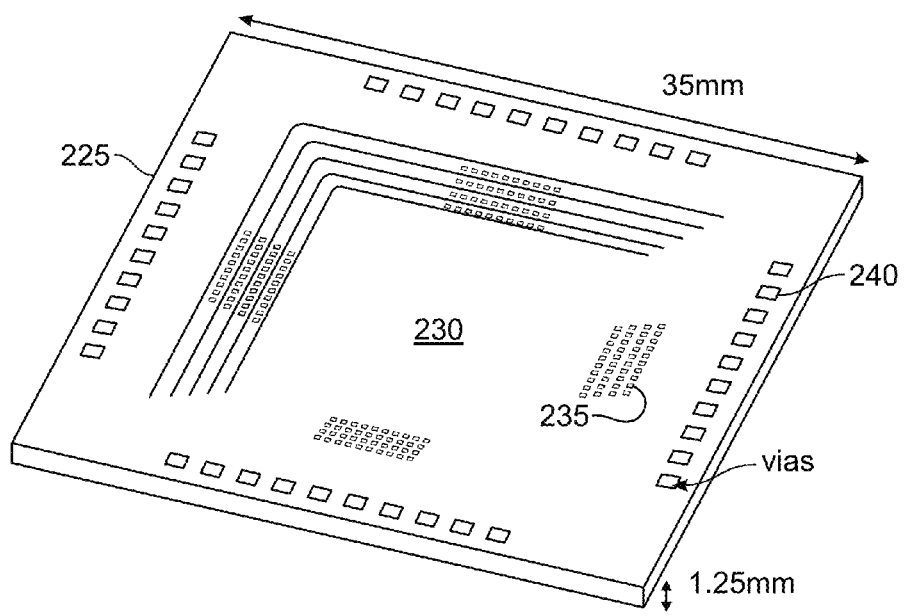
Figure 6:
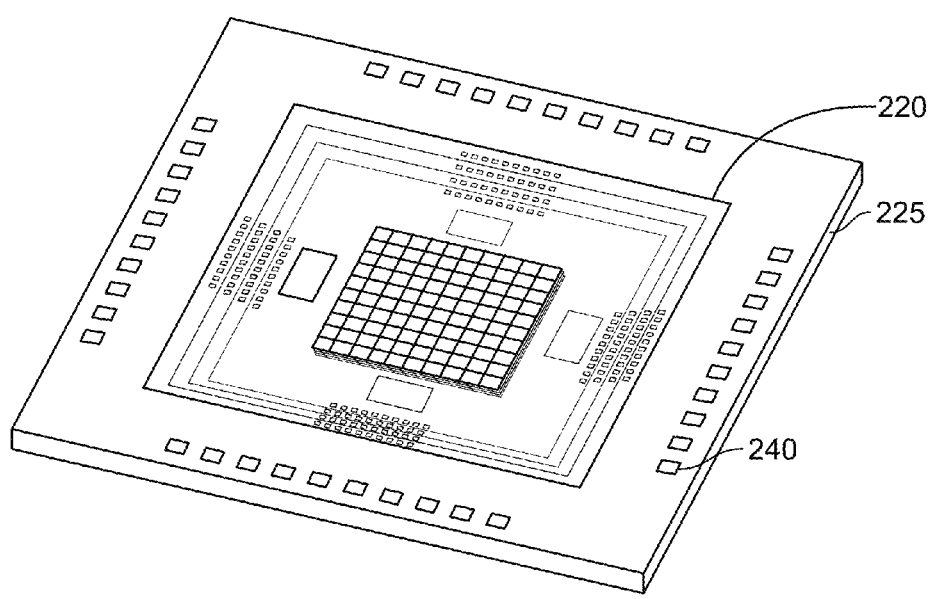

FIGS. 4-6 provides an example of a 3D array in which four carriers 220 of the kind shown in FIG. 3 are stacked on a ceramic receiver plate 225, which is exemplarily 35 mm square and 1.25 mm thick. FIG. 4 is an exploded view of the full assembly. FIG. 5 shows only the receiver plate 225. FIG. 6 shows the completed assembly from above.

As best seen in FIG. 5, a square recess 230 is formed in the receiver plate. The recess wall is beveled with a staircase-like progression of four ledges, each of which supports the periphery of one of the four carriers. Each ledge is provided with a row 235 of pads for electrical contact with the corresponding carrier. The contact pads may, e.g., be connected to vias 240 that are arranged at the periphery of the receiver plate and provide electrical continuity between the front and back faces of the receiver plate. The vias are useful, e.g., for system-level communication in an assembly consisting of a stack of multiple receiver plates.

Although the specific example of a neutron detector has been described here, it is important to recognize that implementations for detection of any of various types of radiation are feasible with a suitable choice of a converter material or a combination of two or more converter materials and with such dimensional modifications as may be necessary in view of the penetration distances of the particles to be detected. All such implementations should be understood to lie within the scope and spirit of the invention.

In particular, implementations of our detector for detecting gamma rays and energetic x-rays (collectively, "gamma radiation" or "gamma photons") are likely to be important. One useful route to detecting gamma radiation is through interactions with the photoelectrons produced when gamma photons are scattered by high atomic number ("high-Z") atoms. The photoelectrons, in turn, interact with the silicon to produce electron-hole pairs that are collected as explained above.

Some relatively efficient converter materials for producing gamma photoelectrons are tungsten and depleted uranium. Uranium, in the compound form uranium dioxide, may be of special interest because it is a semiconductor, and as such might be made to cooperate with the surrounding silicon in the generation and sweepout of radiation-generated electrons and holes.

Gadolinium-157 may also be of interest as a converter material for neutrons. There is a very high cross section for the thermal neutron capture reaction $^{157}$Gd $(n,\gamma)^{158}$Gd, which produces prompt gamma rays with an energy spectrum of up to 7 MeV, as well as x-rays and electrons that are released due to internal conversion and Auger processes. The electrons and at least a portion of the x-rays may be stopped directly in the silicon substrate material, leading to charge generation. To improve detector efficiency, it might be advantageous to add a second, high-Z converter material such as tungsten in selected groups of pores to stop some of the highly penetrating gamma radiation and transfer its energy to photoelectrons.

Lithium and beryllium in elemental or compound form may be useful as converter materials for gamma-ray detection. Xenon may also be useful as a converter material for gamma-ray detection. Xenon would be provided as a pressurized gas fill within a sealed pressure vessel.

Liquefied propane and methane may be useful as converter materials for neutron detection and for gamma-ray detection. Methane could be of particular interest because in addition to its utility as an effective converter material, it is also a good charge carrier. In some implementations of, e.g., a methane-filled detector, the pixel size may be controlled in such a way that gamma interactions can be discriminated from neutron interactions according to the particle range within the detector. That is, if the pixel size is smaller than the range of the particles being detected, then the measured range can help to discriminate the particle type.

In this regard, one way to control the pixel size is to set the pixel size according to the size of the electrode. One convenient electrode size is 300 μm×300 μm. Variations both above and below these numbers are feasible.

Figure 7:
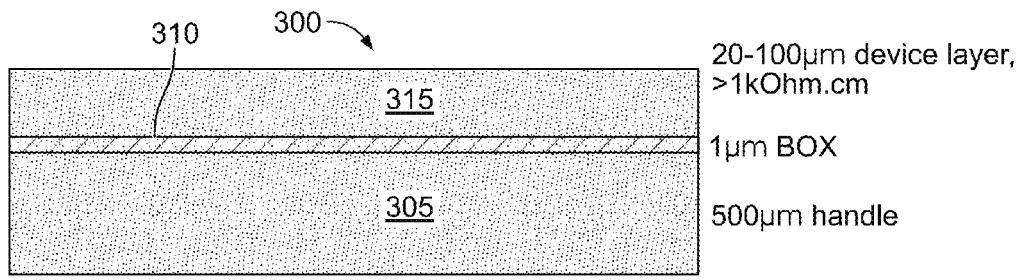
FIGS. 7-13 are schematic illustrations of sequential stages in the fabrication of a radiation detector, using standard CMOS techniques, according to an embodiment of the invention.

FIGS. 7-13 illustrate sequential steps of an exemplary process for fabricating the detector of FIG. 1 using standard CMOS techniques. As seen in FIG. 7, the starting material is an SOI wafer 300 having a 500-μm silicon handle layer 305, a 1-μm silicon dioxide BOX layer 310, and a silicon device layer 315 that is 20-100 μm in thickness. For ease of achieving the desired electronic properties, a resistivity greater than 1 kΩ-cm is preferred. It is noteworthy that this resistivity is about three times the resistivity (300 Ω-cm) of the wafers that Lehmann and Foell, supra, used to produce pores with diameters of 10 μm. Smaller diameters were obtained with lower resistivities. Hence, tuning of the pore diameters might involve some tradeoff against the desired electronic properties of the substrate.

Figure 8:
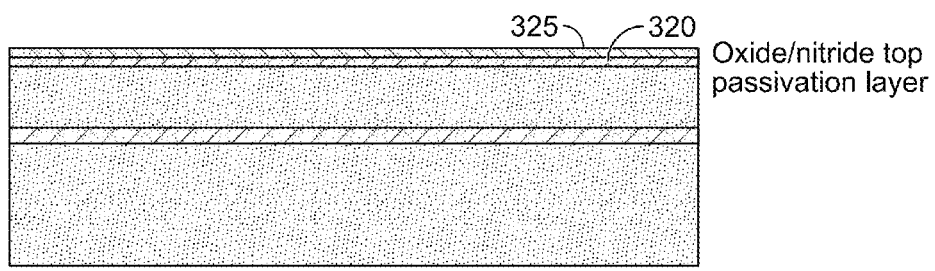
Figure 9:
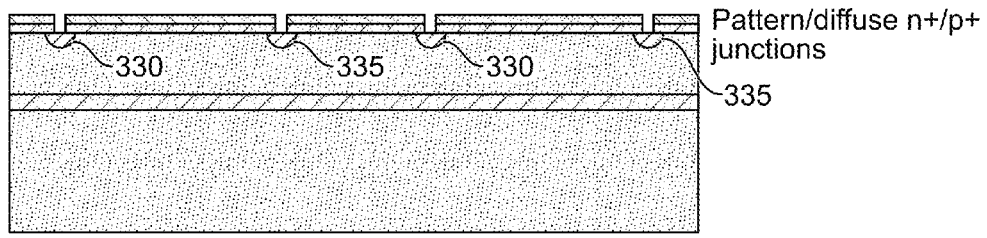

As seen in FIG. 8, a dual passivation layer 320 of silicon dioxide overlain by silicon nitride 325 is added to the top of the wafer. Then, as seen in FIG. 9, the passivation layer is lithographically patterned and etched, and p-type and n-type dopants are introduced and diffused to respectively create the p+ and n+ regions 330, 335 that form the diode junctions.

Figure 10:
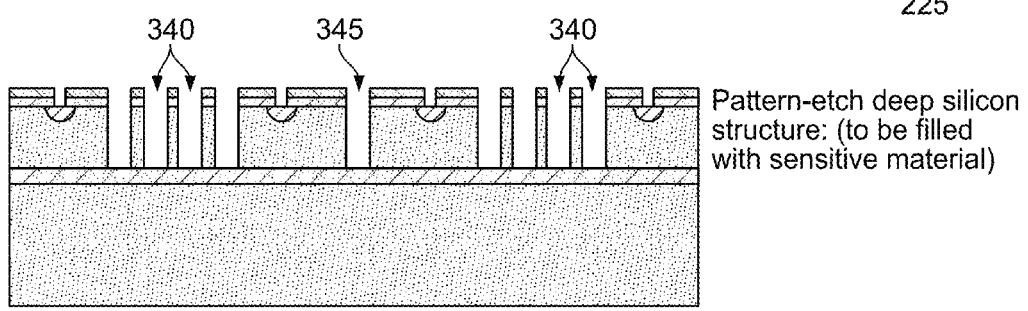

As seen in FIG. 10, the wafer is then lithographically patterned and etched from the passivation layer down to the BOX to form the pores 340 and to form trenches 345 for the partitions between respective diode structures. As explained above, the pores can be made by first producing etch pits by alkaline etching using the patterned passivation layer as a mask, followed by anodic etching in hydrofluoric acid. Alternatively, the pores can be made by RIE.

It should be noted in this regard that prior to the HF etch, if used to form the pores, the wafer surface can be passivated with a nitride layer that is impervious to the acid etchant and thus protects underlying structures such as implanted or diffused junction regions. If the pores are made by RIE, it would be typical to use a Bosch etching process. The Bosch etch is currently capable of creating pores of aspect ratio up to about 20. For example, it could be used to create pores 2 μm in diameter and 40 μm deep.

Figure 11:
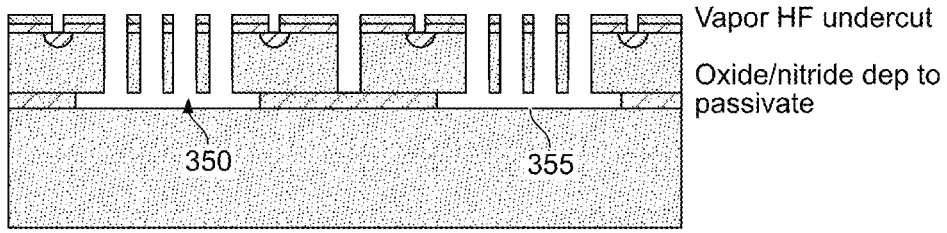
Figure 12:
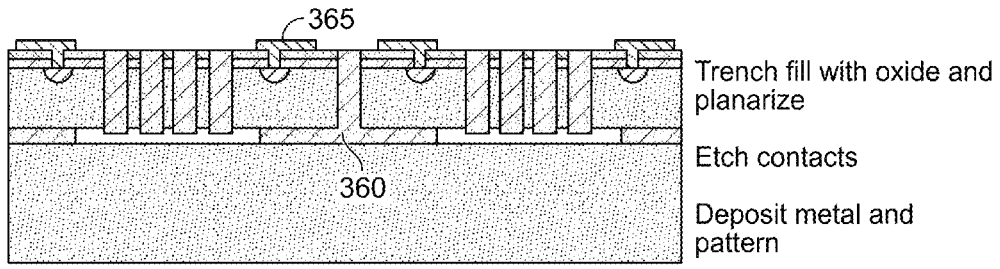

As seen in FIG. 11, the pores are then undercut with a cavity 350 formed by HF vapor etching, and the inner surfaces of the pores and cavities, as well as the trenches for the partitions, are coated with a dual oxide/nitride passivation layer 355. As seen in FIG. 12, the pores and trenches are then filled with silicon dioxide 360 and planarized, contact openings are etched, and metal 365 is deposited and patterned for the diode contacts.

Figure 13:
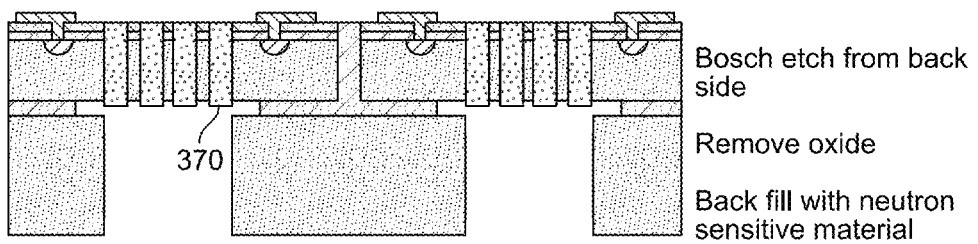

As seen in FIG. 13, a Bosch etch from the back side of the wafer removes handle material and BOX from behind the pores, and the pores are back filled with the converter material 370. The converter material may be grown from vapor or deposited from a solution or slurry. For some applications, it may be advantageous to deposit the converter material in the form of beads or other nanoparticles. In some implementations, the pores may be filled by immersion in a liquid or gaseous converter material.

The remaining portion of the handle layer may be left in place, or it may be etched away to yield the final conformation shown in FIG. 1.

Figure 14:
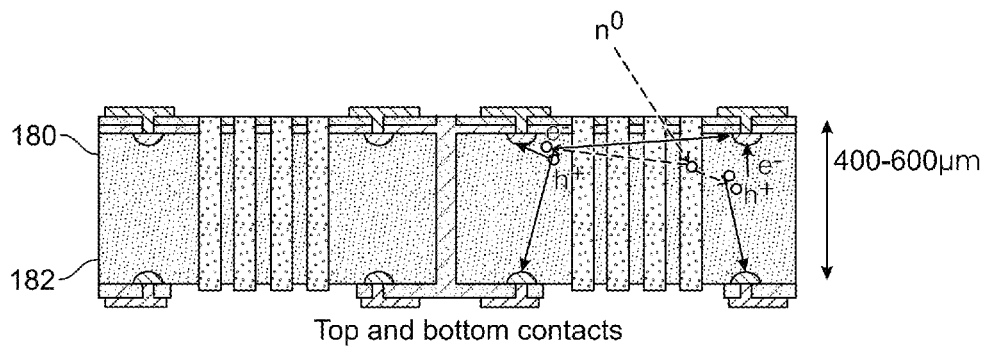
FIG. 14 is a schematic cross sectional diagram of a radiation sensor according to an alternate embodiment of the invention.

FIG. 14 shows an alternate embodiment in which the p-type regions 180 and their contacts are on the front side of a bulk silicon wafer, and the n-type regions 182 and their contacts are on the back side of the wafer. An exemplary process for making the device of FIG. 14 is similar to the process described above, except that only the the p-type regions and their contacts are formed on the front side of the wafer. To form the n-type regions and their contacts, analogous processing is then performed on the back side of the wafer.

Figure 15:
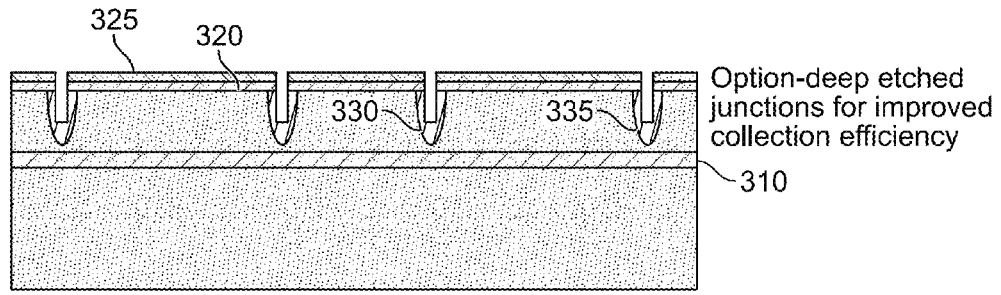
FIG. 15 is a schematic cross-sectional diagram illustrating a variation of the processes of FIGS. 7-13, particular those processes illustrated in FIG. 9, in which deep junction regions are formed.

FIG. 15 shows a variation of the processes of FIG. 9, in which the junction regions 330, 335 are formed after etching the substrate to greater depth to improve the efficiency of charge collection. Doping at such increased depth may be achieved, e.g., by diffusion from doped glass sources. (Borosilicate or phosphosilicate glass may be used for such a purpose.) Doping would be followed by back-filling with a contact material such as tungsten or doped polysilicon.

Figure 16:
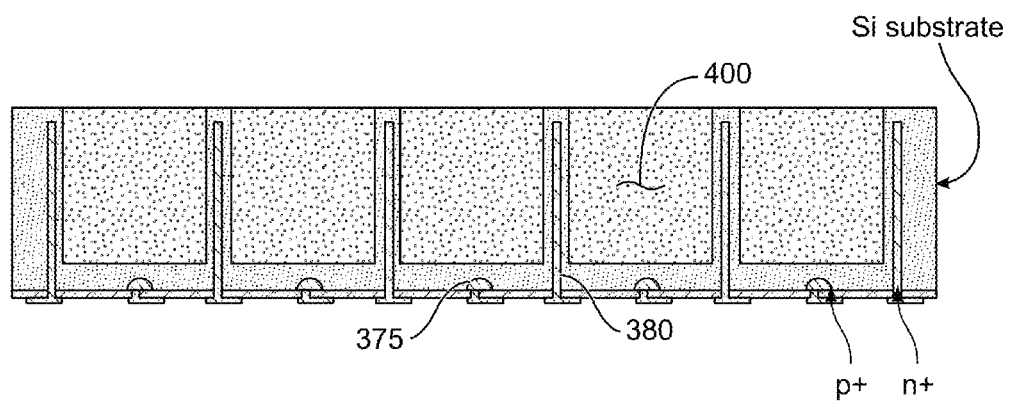
FIGS. 16-17 are schematic cross-sectional diagrams of sensors, in two alternate embodiments, that include deep junction regions such as FIG. 15 illustrates
Figure 17:
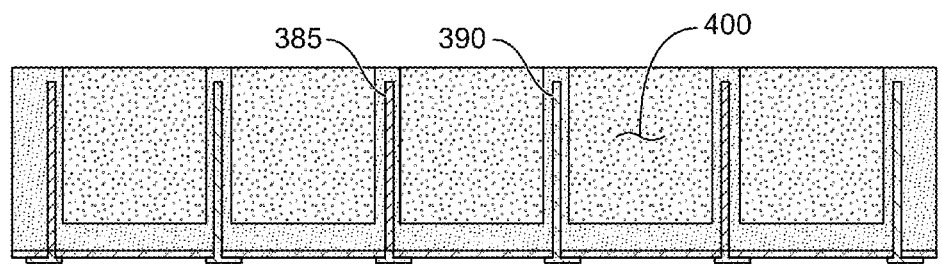

FIGS. 16 and 17 illustrate two possible implementations that include deep junction regions. In FIG. 16, the p-type side 375 of the junction is a concentrated area on the bottom (in the figure view) of the wafer, and the n-type side 380 of the junction is an elongated substantially vertical region that extends through most or all of the wafer thickness. The figure shows a row of five diode structures that are not separated by any dielectric barriers. This is illustrative of one possible arrangement, in which a multiplicity of diode structures arranged in a linear or 2D array are not separately pixelated. For spatial discrimination, a plurality of such arrays may be arranged on the wafer and separated by dielectric barriers. In alternate embodiments, the dominant carrier types of the respective sides of the junction may be interchanged.

In FIG. 17, both sides 385, 390 of the junction are conformed as elongated substantially vertical regions that extend through most or all of the wafer thickness. As a consequence, the electric field that is produced in each diode structure under reverse bias is substantially horizontal relative to the wafer orientation.

The doped regions indicated in FIGS. 16 and 17 may be conformed as pillars disposed, e.g., in a rectangular or hexagonal array. Alternatively, the doped regions may be conformed as walls that enclose cells of porous silicon 400, or as walls that meander without forming enclosures.

FIGS. 18-23 illustrate sequential steps of an exemplary process for fabricating the detector in another implementation, in which the respective sides of the junction are disposed in layers on opposing faces of the wafer. The steps illustrated by the figures may be performed using standard CMOS techniques.

Figure 18:
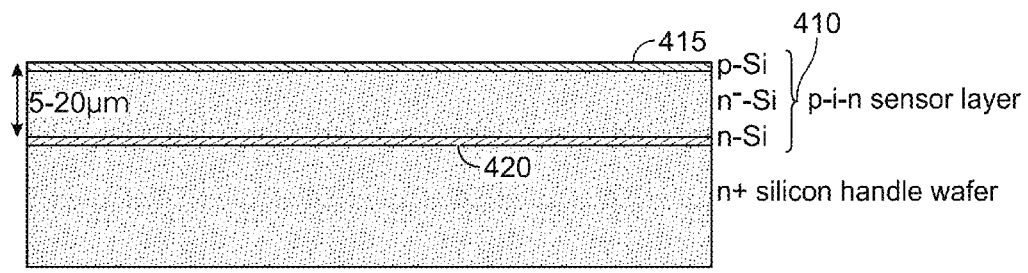
FIGS. 18-23 illustrate sequential steps of an exemplary process for fabricating a detector according to another alternate embodiment of the invention.
Figure 19:
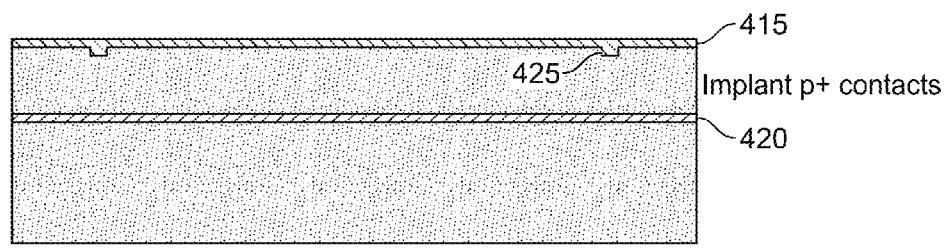

As seen in FIG. 18, the starting material is an n+ doped SOI wafer 405 having a 500-μm silicon handle layer. Alternatively, a bulk silicon wafer could be used. A p-i-n sensor layer 410 is formed by p-type surface doping 415 and n-type ion implantation in a layer 420 lying at a depth of 5-20 μm. As seen in FIG. 19, p+ contact regions 425 are formed by ion implantation.

Figure 20:
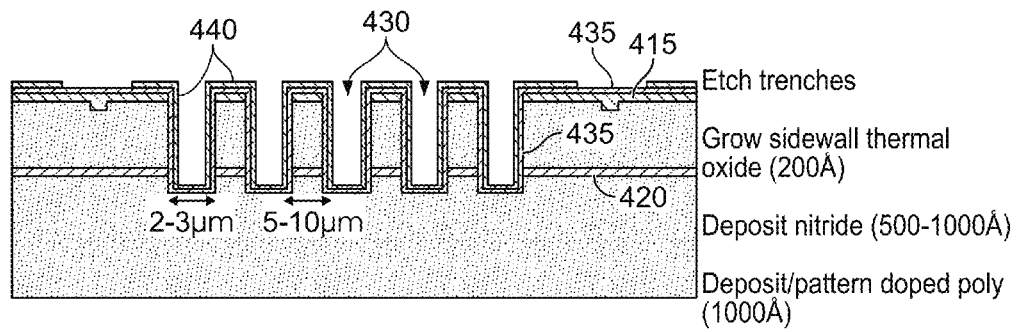

As seen in FIG. 20, pores 430 are etched, e.g. by techniques already referred to above. It is noteworthy in this regard that it is not essential for the pores to be cylindrical, even though examples provided above have made such an assumption. The pores may in fact have square, rectangular, or other nominal cross sections. In the particular example of FIGS. 18-23, among others, the pores may advantageously be conformed as trenches, i.e. as features that are nominally rectangular in cross section with length-to-width ratios greater than 2 and possibly even greater than 10 or more. In an example, the pores are etched to a depth slightly below the n-type implanted layer, with a width or diameter of 2-3 μm and a separation (between facing edges) of 5-10 μm.

With further reference to FIG. 20, the walls of the pores 430 are passivated with a growth of 200 Å of thermal oxide, also grown on the front side of the wafer, which is followed by deposition of 500-1000 Å of silicon nitride 435. This is followed by deposition of 1000 Å of a doped polysilicon gate layer 440 over the nitride layer, and lithographic patterning of the polysilicon to remove it from over the p-type contact regions.

The polysilicon layer is operated as a gate electrode. The gate electrode can be voltage-controlled to achieve low dark current by depleting, inverting, or accumulating the sidewall surfaces, depending on the mode of operation of the sensor. The gate electrode can also allow the sensor to operate for longer periods. That is, the reaction products from conversion of the incident radiation are continuously implanted through the dual passivation layer, which leads to charge and defect accumulation in these dielectrics as well as in the junction region. By electrically controlling the interface, the consequent dark current can be at least partially suppressed.

Figure 21:
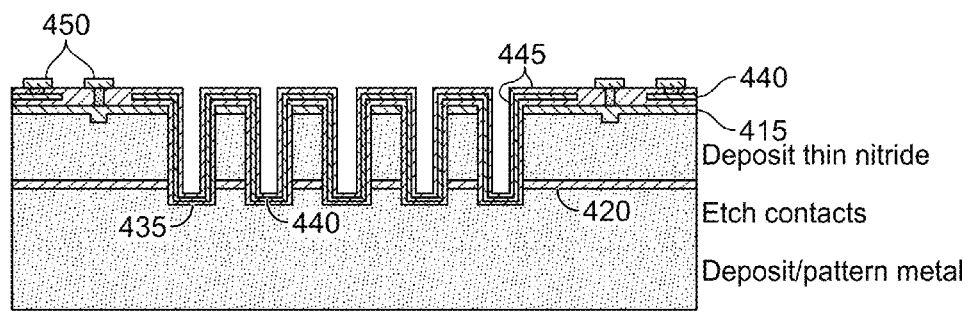
Figure 22:
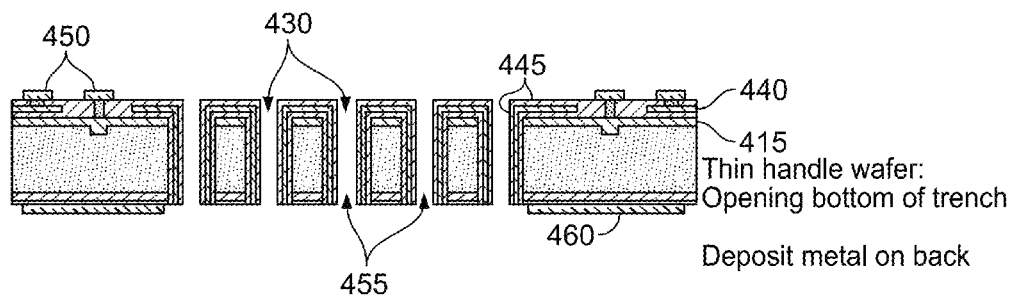

With reference to FIG. 21, a thin nitride layer 445 is deposited, patterned, and etched to form openings for the electrical contacts. Contact metal is then deposited and patterned to form the contacts 450 to the p-type contact regions 415 and to the gate electrode 440. With reference to FIG. 22, the handle layer is then thinned from the back side until the bottoms 455 of the pores are opened. A metal layer 460 for making contact to the n-type contact region is then deposited.

Figure 23:
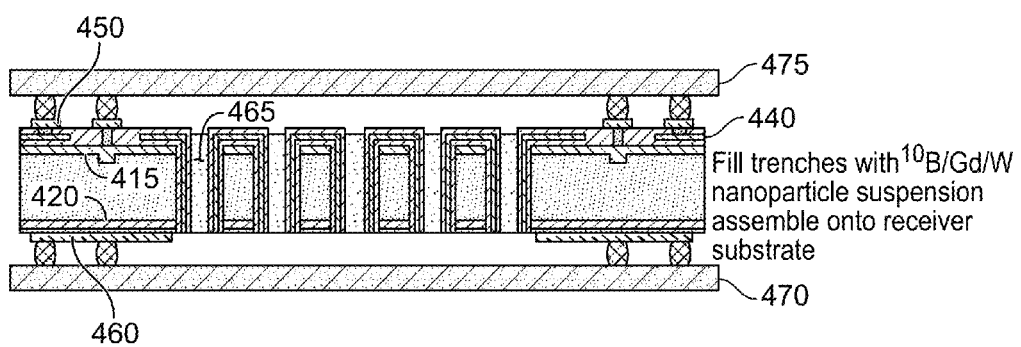

With reference to FIG. 23, the pores are filled with converter material 465. In one example, the pores are filled with a suspension of nanoparticles containing, or consisting of, boron-10, gadolinium-157, or tungsten. The processed wafer is then assembled onto a substrate 470, 475 such as the receiver plates referred to above.

J. A. Nelson et al., "Solution Synthesis of Gadolinium Nanoparticles," *J. Am. Chem. Soc.* 9, Vol. 124, No. 12 (2002) 2979-2983 describes a method for preparing gadolinium nanoparticles that might be useful in the present context. The nanoparticles reported by Nelson et al. were prepared by alkalide reduction of gadolinium trichloride. The nanoparticles were initially recovered as metallic gadolinium. The nanoparticles oxidized to gadolinium oxide on exposure to air but remained as distinct spheroidal particles. The average diameter of the oxidized particles was about 12 nm. A suspension of such particles in a carrier fluid of, e.g. methanol may be used to fill the pores in, e.g., the device of FIG. 23.

The useful lifetime of a sensor, such as the sensor of FIG. 23, might be limited by the accumulation of defects in the passivation dielectrics and in the junction region. One consequence of aging, which might limit the useful lifetime, is increasing dark current. A high temperature anneal, exemplarily at about 200-300° C., depending on device assembly and materials, could possibly extend the lifetime by partly ameliorating some of these defects. However, replacement might be necessary after the dark current has exceeded a certain threshold, or after the device has completely degraded as evidenced, e.g., by dielectric breakdown in the passivation films. It is noteworthy in this regard that the life of a highly pixellated detector might be extended by reconfiguring it to disable those pixels that exhibit unacceptably high dark current.

What is claimed:

1. A detector for radiation of at least one type, comprising:
    a silicon body having a horizontal lateral extent and containing multiple vertical pores at least partially filled with converter material, each pore being a void that is vertically extensive to a pore depth and enclosed within silicon walls;
    at least one n-type region and at least one p-type region defined within the silicon body and arranged such that under appropriate biasing conditions, a plurality of said vertical pores are situated within a carrier-depletion region of the silicon body; and
    at least one charge-collection electrode, wherein:
    the converter material is selected to produce secondary particles when impinged by radiation of at least one said type;
    each of the charge-collection electrodes is arranged to collect current generated when secondary particles enter the silicon body through walls of the pores;
    each pore has a thickness defined as the pore diameter or, if the pore is not round, a smallest lateral dimension of the pore;
    the pores are disposed in one or more clusters having a silicon density in the range 20% to 50% the solid density of the silicon body;
    most or all of the pores in each said cluster have a pore thickness less than or equal to 5 µm;
    most or all of the pores in each said cluster have an aspect ratio, defined as the ratio of pore depth to pore thickness, of at least 10;
    the at least one n-type region and the at least one p-type region are respective junction-forming regions that define a diode structure in the silicon body;
    the at least one n-type region and the at least one p-type region are situated outside of at least a given one of the clusters; and
    the at least one n-type region and the at least one p-type region are arranged such that under the appropriate biasing conditions, substantially all of the given cluster is situated within a carrier-depletion region of the diode structure defined by the at least one n-type region and the at least one p-type region.

2. The detector of claim 1, wherein most or all of the pores in each said cluster have a pore thickness less than or equal to 2 µm.

3. The detector of claim 1, wherein:
    the detector has a detection energy range for primary particles;
    the secondary particles have a mean range in the converter material for each energy of primary particles that generate the secondary particles within the converter material; and
    the pore thickness is no greater than a mean secondary particle range for at least one primary particle energy within the detection energy range.

4. The detector of claim 1, wherein most or all of the pores in each said cluster have a pore depth of at least 20 µm.

5. The detector of claim 1, wherein the p-type and n-type regions are disposed in vertically oriented layers such that under reverse bias, each pore is subjected to a substantially horizontal electric field.

6. The detector of claim 1, wherein the p-type and n-type regions are disposed asymmetrically, such that the region or regions of one carrier dominance modality are disposed in vertically oriented layers, and the region or regions of the other carrier dominance modality are disposed at or near a bottom face of the silicon body.

7. The detector of claim 1, further comprising a gate electrode arranged to promote carrier depletion within the semiconductor body under appropriate biasing conditions.

8. The detector of claim 1, wherein:
    the n-type and p-type regions are arranged such that at least one cluster of pores is wholly contained within a carrier depletion region when the detector is under reverse bias.

9. The detector of claim 1, wherein the converter material comprises tungsten, the secondary particles are gamma-ray and/or x-ray photoelectrons, and the apparatus further comprises a dielectric liner surrounding each of the pores.

10. The detector of claim 9, wherein each of the pores has an inward-facing wall surface, and the dielectric liners are oxide layers on the inward-facing wall surfaces.

11. The detector of claim 1, wherein the converter material comprises uranium oxide and the secondary particles are alpha particles.

12. The detector of claim 1, wherein:
    a plurality of charge-collection electrodes are arranged to collect current from respective spatially separated portions of the silicon body that contain pores and that correspond to respective pixels; and
    the detector further comprises an image-processing circuit in receiving relationship to current output from the charge-collection electrodes.

13. The detector of claim 1, wherein:
    the said silicon body is one of a plurality of similar silicon bodies arranged in an array on a substrate such that each said body corresponds to a respective pixel area;
    each of the silicon bodies contains one or more of said pores; and
    the detector further comprises an image-processing circuit in receiving relationship to current output from charge-collection electrodes connected to the respective silicon bodies.

14. The detector of claim 1, wherein the converter material comprises one or more chemical elements in elemental or compound form selected from the group consisting of: gadolinium, tungsten, and uranium.

15. The detector of claim 1, wherein the converter material comprises one or more chemical elements in elemental or compound form selected from the group consisting of: lithium, beryllium, and boron.

16. The detector of claim 1, wherein the converter material comprises propane and/or methane.

17. The detector of claim 1, wherein the converter material comprises xenon.

* * * * *